(12) United States Patent
Bame et al.

(10) Patent No.: US 10,396,497 B1
(45) Date of Patent: Aug. 27, 2019

(54) PLUG-IN MODULE INJECTOR LEVER ASSEMBLY, KIT, AND METHOD

(71) Applicant: Wavetherm Corporation, Raleigh, NC (US)

(72) Inventors: Rodney Bame, Cary, NC (US); David Mosier, Jr., Raleigh, NC (US)

(73) Assignee: Wavetherm Corporation, Raleigh, NC (US)

( * ) Notice: Subject to any disclaimer, the term of this patent is extended or adjusted under 35 U.S.C. 154(b) by 0 days.

(21) Appl. No.: 16/090,894

(22) PCT Filed: Apr. 23, 2018

(86) PCT No.: PCT/US2018/028792
§ 371 (c)(1),
(2) Date: Oct. 3, 2018

(51) Int. Cl.
*H01R 13/62* (2006.01)
*H01R 13/629* (2006.01)
*H05K 7/14* (2006.01)

(52) U.S. Cl.
CPC . *H01R 13/62938* (2013.01); *H01R 13/62966* (2013.01); *H05K 7/1489* (2013.01)

(58) Field of Classification Search
CPC ........ H01R 13/62977; H01R 13/62966; H01R 13/62972; H01R 13/62938; H01R 13/62933; H05K 7/00; H05K 7/12; H05K 7/14; H05K 7/1409; H05K 7/1489
See application file for complete search history.

(56) References Cited

U.S. PATENT DOCUMENTS

| | | |
|---|---|---|
| 3,476,258 A | 11/1969 | Dorsett |
| 4,083,616 A | 4/1978 | McNiece et al. |
| 4,521,063 A | 6/1985 | Milc |
| 4,699,594 A | 10/1987 | Assel et al. |
| 4,780,792 A | 10/1988 | Harris et al. |
| 4,804,335 A | 2/1989 | Pennington |
| 4,902,239 A | 2/1990 | Schindler |
| 5,006,951 A | 4/1991 | Albert et al. |
| 5,222,897 A | 6/1993 | Collins |
| 5,268,821 A | 12/1993 | Wong |
| 5,293,303 A | 3/1994 | Fletcher et al. |
| 5,414,594 A | 5/1995 | Hristake |
| 6,148,506 A | 11/2000 | Vermette |
| 6,246,585 B1 | 6/2001 | Gunther et al. |
| 6,267,614 B1 * | 7/2001 | Good .................. H01R 13/639 439/160 |
| 6,373,713 B1 | 4/2002 | Jensen et al. |

(Continued)

FOREIGN PATENT DOCUMENTS

EP 0660653 A1 6/1995

*Primary Examiner* — Xuong M Chung Trans
(74) *Attorney, Agent, or Firm* — Coats + Bennett, PLLC

(57) ABSTRACT

A lever assembly for mounting to a removable plug-in module for selectively engaging a lip of a rack for effecting an injection of the plug-in module into the rack, and related kit(s) and method(s). The lever assembly includes a lever handle, an elastic bias element mounted to the lever handle, a pivot arm pivotally mounted to the lever handle, a pawl pivotally mounted to the lever handle, and a pivot axle. The pivot arm and the pawl abut one another so that a rotational force applied to a forward free end of the pivot arm, urging the pivot arm to rotate away from a lower interior surface of the lever handle, is transmitted to the pawl so that a rearward tip of the pawl is urged to rotate upward.

20 Claims, 12 Drawing Sheets

(56) References Cited

U.S. PATENT DOCUMENTS

| | | | |
|---|---|---|---|
| 6,383,713 | B1 | 5/2002 | Uetani et al. |
| 6,955,550 | B2 | 10/2005 | Schlack |
| 7,264,490 | B1 * | 9/2007 | Reznikov ......... H01R 13/62933 439/152 |
| 7,295,447 | B2 * | 11/2007 | Strmiska .............. H05K 7/1409 312/223.2 |
| 9,585,283 | B2 | 2/2017 | Chia et al. |
| 2003/0172523 | A1 | 9/2003 | Joist et al. |
| 2004/0077198 | A1 | 4/2004 | Schlack |
| 2005/0136715 | A1 | 6/2005 | Shclack |
| 2006/0215373 | A1 | 9/2006 | Joist et al. |
| 2007/0149018 | A1 | 6/2007 | Gunther et al. |
| 2013/0107424 | A1 | 5/2013 | Thomas et al. |
| 2013/0130528 | A1 | 5/2013 | Jun et al. |
| 2014/0187068 | A1 | 7/2014 | Chia |
| 2015/0074992 | A1 | 3/2015 | Chen |
| 2016/0120056 | A1 | 4/2016 | Kuang et al. |

\* cited by examiner

PLUG-IN MODULE INJECTOR LEVER ASSEMBLY, KIT, AND METHOD

TECHNICAL FIELD

This disclosure relates to a lever assemblies for assisting in the insertion of plug-in modules, such as electronics modules, into rack mounting systems, and related methods and/or devices.

BACKGROUND

The use of plug-in modules are well known, particularly in the industrial electronics and aviation fields. In general, the plug-in modules are inserted into module frames (or "racks") from the front by sliding on guides in such a way that the partial outward facing panels of the plug-in modules are adjacent to each other. Each plug-in module is typically connected, with the help of suitable connector(s), to a rear wiring board or backplane. Due to the ever-increasing packing density on the individual plug-in modules and the progressing miniaturization of electronic components, connectors with increasing numbers of terminals or "pins" are being used with plug-in modules. Significant force is sometimes required to insert the plug-in module sufficiently to make and/or maintain sufficient connector contact.

Pivoting lever systems are sometimes attached to the plug-in modules to assist in the insertion, and optionally the removal (sometimes called "extraction" or "ejection"), of the plug-in modules. Examples of such lever systems are described in U.S. Pat. Nos. 3,476,258 and 5,414,594. In the industry, the lever systems are sometimes broadly referred to as inserter-ejectors, or injector-ejectors. While a variety of injector-ejector designs for plug-in modules are known, they have not proven satisfactory for all situations, particularly where greater but constrained forces are required. As such, there remains a need for alternative lever assemblies for assisting in the insertion of plug-in modules, and related methods and/or devices.

SUMMARY

In one or more aspects, the present disclosure is related to a lever assembly for mounting to a removable plug-in module for selectively engaging a lip of a rack for effecting an injection of the plug-in module into the rack. The lever assembly includes an elongate lever handle, an elastic bias element, a pivot arm, a pawl, and a pivot axle. The elongate lever handle has a rearward portion and a forward portion extending along a lever handle longitudinal axis. The lever handle has a lower interior surface. The rearward portion having a first pivot axis and a second pivot axis that are both fixed relative to the lever handle. The second pivot axis is spaced from the first pivot axis and disposed downward farther from the lower interior surface than the first pivot axis. The elastic bias element is mounted to the lever handle. The pivot arm is pivotally mounted to the lever handle for rotation relative to the lever handle about the first pivot axis. The pivot arm has a forward free end abutting the elastic bias element. The pawl is pivotally mounted to the lever handle for rotation relative to the lever handle about the second pivot axis. The pawl has a rearward tip and a forward bearing surface. The pivot axle mounts the pawl to the lever handle for rotation about the second pivot axis. The pivot arm is disposed operatively between the pawl and the elastic bias element such that the pawl is spaced from the elastic bias element. The pivot arm and the pawl are configured such that, in response to a force being applied to the pivot arm's forward free end, urging the pivot arm to rotate away from the lower interior surface, while the pawl abuts the pivot arm, the force is transmitted to the pawl so that the pawl's rearward tip is urged to rotate upward.

In some aspects, the lever assembly is movable between a first configuration and a second configuration. In the first configuration: 1) an arm spacing distance between the pivot arm's free end and the lower interior surface is a first spacing amount; and 2) a pawl vertical displacement distance between the second pivot axis and the pawl's tip, measured perpendicular to the lever handle longitudinal axis, is a first displacement amount. In the second configuration: 1) the arm spacing distance is a second spacing amount, smaller than the first spacing amount; 2) the pawl vertical displacement distance is a second displacement amount, smaller than the first displacement amount; 3) the elastic bias element is more loaded than in the first configuration; and 4) the pawl's bearing surface presses against the pivot arm so as to press the pivot arm's free end toward the lower interior surface against a resisting bias of the elastic bias element. The pawl remains spaced from the elastic bias element in both the first and second configurations. In some aspects, the pawls bearing surface abuts the pivot arm at different locations in the first and second configurations. In some aspects, the elastic bias element is in a free state in the first configuration. In some aspects, in the second configuration, the pawl's bearing surface abuts the pivot arm at a location not more than ⅓ of the way from the first pivot axis to the point where the pivot arm's forward free end abuts the elastic bias element. In some aspects, the pivot arm includes a bearing surface disposed proximate the first pivot axis and configured to be abutted by the pawl's forward bearing surface; and the pivot arm's bearing surface is angled relative to the lower interior surface when the assembly is in the first configuration. In some aspects, the second displacement amount is not more than 0.10 inches in the second configuration; and the lever assembly is configured to generate, in the second configuration, an upward force at the rearward tip of at least fifty pounds and not more than one hundred twenty pounds.

In some aspects, the lever assembly is further movable to a third configuration; wherein, in the third configuration: 1) the arm spacing distance is a third spacing amount, smaller than the second spacing amount; 2) the pawl vertical displacement distance is a third displacement amount, smaller than the second displacement amount; 3) the elastic bias element is more loaded than in the second configuration; 4) the pawl's bearing surface presses against the pivot arm so as to press the pivot arm's free end toward the lower interior surface against the resisting bias of the elastic bias element; and 5) the pawl remains spaced from the elastic bias element.

In some aspects, the elastic bias element comprises a first leaf spring. In some aspects, the lever handle includes first and second downwardly extending flanges disposed on opposing sides of the lower interior surface with a flange gap therebetween, and the first and second pivot axes both extend through both the first and second flanges; and the pawl is thinner than the flange gap.

In some aspects, the present disclosure is directed to a lever assembly kit, for forming a lever assembly for mounting to a removable plug-in module for selectively engaging a lip on a rack for effecting an injection of the module into the rack. The kit includes a handle assembly, a pawl, and a pivot axle. The handle assembly includes an elongate handle, an elastic bias element, and a pivot arm. The lever handle has a rearward portion and a forward portion extending along a lever handle longitudinal axis. The rearward portion has a first pivot axis and a second pivot axis that are both fixed relative to the lever handle. The lever handle has a lower interior surface. The second pivot axis is spaced from the first pivot axis and disposed downward farther from the lower interior surface than the first pivot axis. The elastic bias element is mounted to the lever handle. The pivot arm is pivotally mounted to the lever handle for rotation relative to the lever handle about the first pivot axis. The pivot arm has a forward free end configured to abut the elastic bias element. The pawl is not operatively mounted to the lever handle so as to be distinct from the lever handle and the pivot arm. The pawl has a rearward tip and a forward bearing surface. The pivot axle is not operatively mounted to the lever handle so as to be distinct from the lever handle. The pivot axle is configured to mount the pawl to the lever handle for rotation about the second pivot axis. The lever handle, the pivot arm, and the pawl are configured such that, when the pawl is mounted to the lever handle via the pivot axle for rotation about the second pivot axis: 1) the pivot arm and the pawl abut one another so that a rotational force applied to the pivot arm's forward free end, urging the pivot arm to rotate away from the lower interior surface, is transmitted to the pawl so that the pawl's rearward tip is urged to rotate upward; and 2) the pivot arm is disposed operatively between the pawl and the elastic bias element such that the pawl is spaced from the elastic bias element. In some aspects, the lever assembly kit, when assembled, forms the lever assembly is as described above.

In some aspects, the present disclosure is directed to a method of inserting a removable plug-in module into a rack, the rack having a lip for facilitating insertion of the plug-in module. The method includes inserting the plug-in module into the rack. The method includes rotating a lever handle of a first lever assembly in a first direction toward the plug-in module. The first lever assembly is mounted to the plug-in module proximate an edge of the plug-in module. The lever handle extends along a lever handle longitudinal axis and has a lower interior surface. The first lever assembly includes the lever handle, a pivot arm, a pawl, and an elastic bias element. The pivot arm is mounted to the lever handle for rotation about a first pivot axis that is fixed relative to the lever handle. The pawl is mounted to the lever handle for rotation about a second pivot axis that is fixed relative to the lever handle, with the second pivot axis being spaced from the first pivot axis and disposed farther from the lower interior surface than the first pivot axis. The rotating of the method occurs while the pawl engages the lip of the rack. The rotating causes: 1) elastic bias element to be deformed; 2) the pivot arm to rotate, relative to the lever handle, about the first pivot axis in a second direction while bearing against the elastic bias element; 3) the pawl to rotate, relative to the lever handle, about the second pivot axis in the second direction; 4) a force to be generated at a rearward tip of the pawl, oriented toward the lever handle longitudinal axis, urging the tip against the lip. During the rotating, the pivot arm stays operatively disposed between the pawl and the elastic bias element such that the pawl remains spaced from the elastic bias element throughout the rotating. In some aspects, the first lever assembly is as described above.

The features, functions and advantages that have been discussed can be achieved independently in various aspects or may be combined in yet other aspects, further details of which can be seen with reference to the following description and the drawings.

DESCRIPTION

Figure 1:
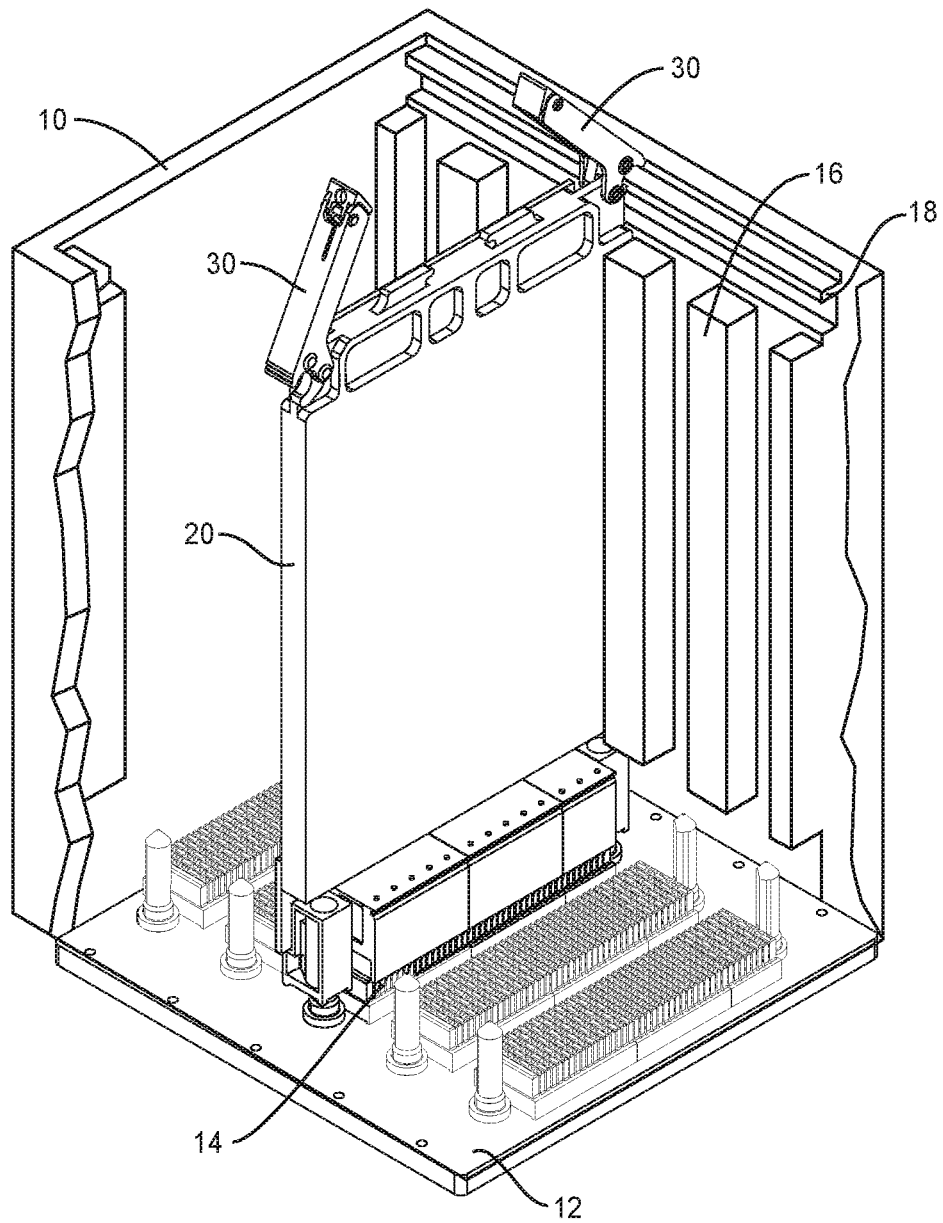
FIG. 1 shows perspective view of a plug-in module inserted into an electronics rack.

In one or more aspects, the present disclosure is generally related to a lever assembly 30 for mounting to a removable plug-in module 20 for selectively engaging a lip 18 of a rack 10 for effecting an injection of the plug-in module 20 into the rack 10. The lever assembly 30 is intended to be rotatably mounted to the plug-in module 20. In some aspects, the lever assembly 30 includes a lever handle 40, a spring 60 mounted to the lever handle 40, a pivot arm 70 pivotally mounted to the lever handle 40, a pawl 80 pivotally mounted to the lever handle 40, and a pivot axle 90. The pivot arm 70 and the pawl 80 abut one another so that a rotational force applied to a forward free end of the pivot arm 70, urging the pivot arm 70 to rotate away from a lower interior surface 50 of the lever handle 40, is transmitted to the pawl 80 so that a rearward tip 86 of the pawl 80 is urged to rotate upward. The movement is caused by rotation of the free end of the lever handle 40 toward the plug-in module 30. The upward rotation of the rearward tip 86 of the pawl 80 causes the pawl 80 to engage the lip 18 on the rack 10, thereby transmitting an insertion force to the plug-in module 30. In some aspects, the lever assembly 30 may also be used to facilitate removal (sometimes called "ejection") of the plug-in module 20 from the rack 10, by rotating the lever handle 40 in the opposite direction. In some aspects, the lever handle 40, the spring 60, and the pivot arm 70 are joined together to form a handle assembly 32, and a lever assembly kit 100 is formed by the handle assembly 32, the pawl 80, and the pivot axle 90.

A removable plug-in module 20 and a portion of a rack 10 are shown in FIG. 1. The plug-in module 20 typically includes a frame and a circuit board with suitable electronics thereon. The plug-in module 20 also includes a connector for connecting the electronics to the circuits of the rack 10, typically via a backplane connector 14 of the rack 10 mounted on backplane 12 of rack 10. The rack 10 includes guides 16 for guiding the sliding insertion and removal of the plug-in module 20, and typically a plurality of backplane connectors 14, and various circuitry. The rack 10 also includes at least one lip 18 disposed in or near the guides 16, with the inner (relative to the insertion direction of the plug-in module 20) side of the lip 18 sometimes referred to in the art as the injection surface, and the opposing outer side of the lip 18 sometimes referred to in the art as the ejection surface. In some racks 10, the guides 16 and/or lips 18 are provided only on one side of each "slot" for receiving the plug-in modules 20; in other racks 10 the guides 16 and/or lips 18 are provided on both sides of the slots. In the interest of clarity, further details of the rack 10 and the plug-in modules 20 are omitted herein as being unnecessary to understand the disclosure, but attention is directed to the standards documents VMEbus International Trade Association (VITA) 48.2 and VITA 78.1 for additional exemplary details.

Figure 2A:
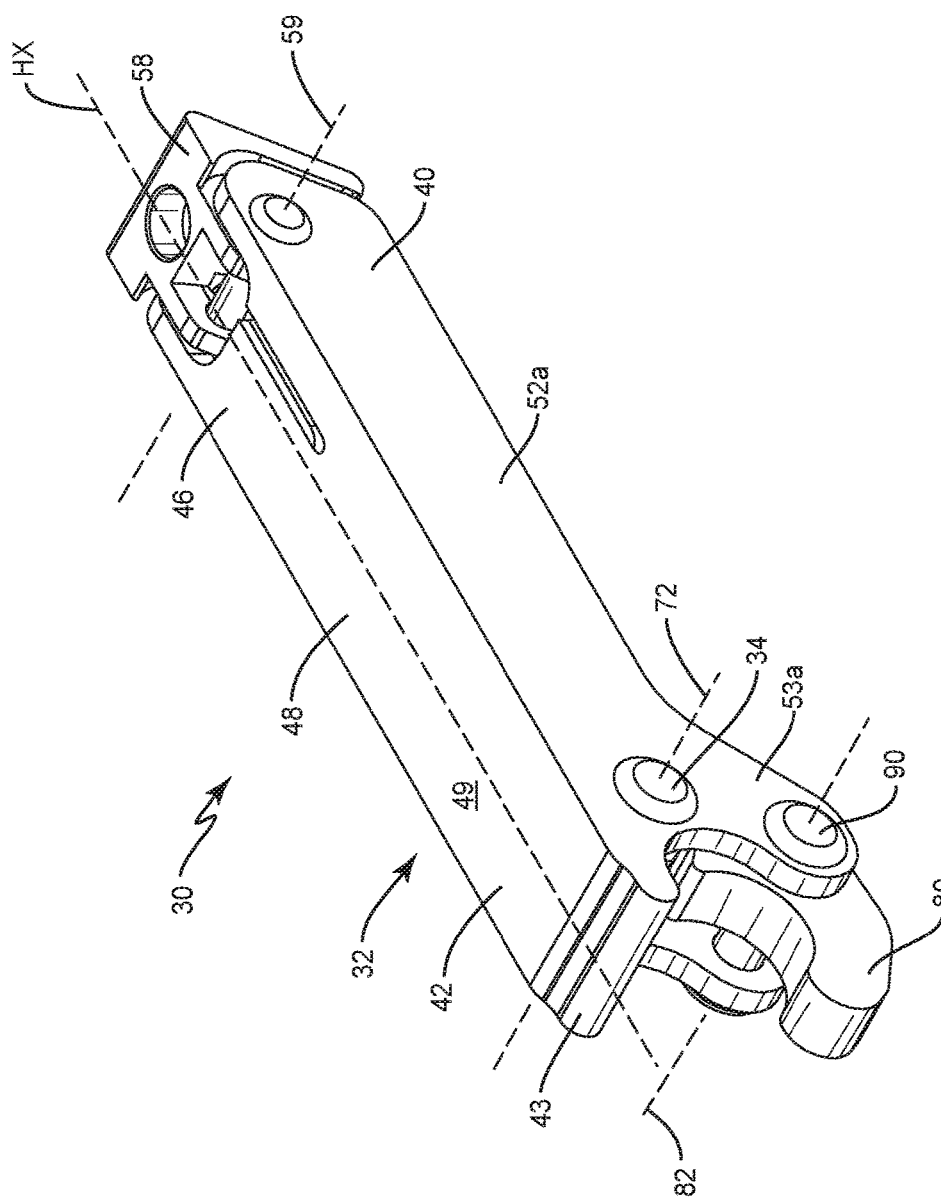
FIG. 2A shows a perspective view of a lever assembly according to one or more aspects.
Figure 6:
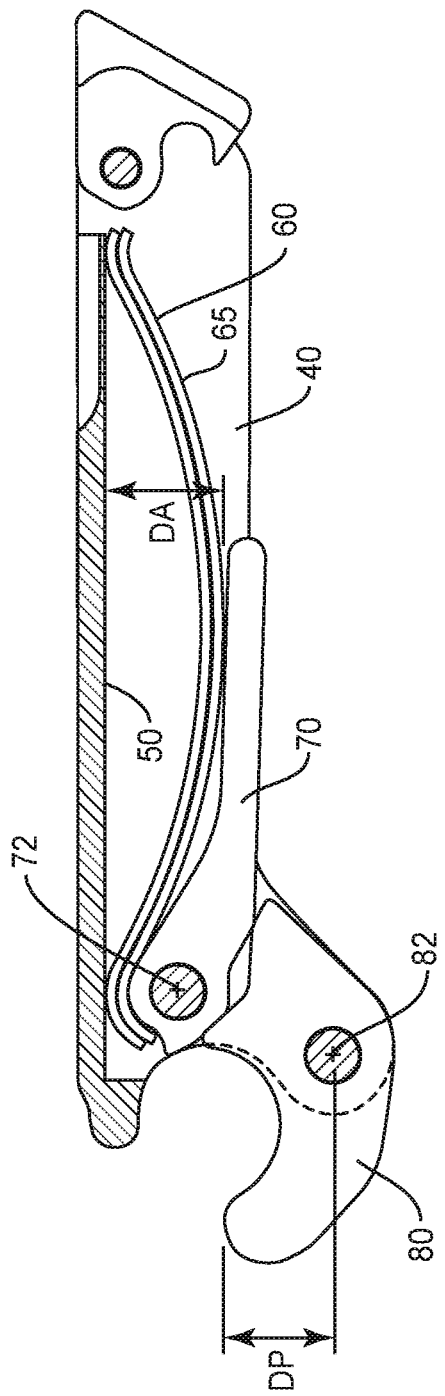
FIG. 6 shows side view of the lever assembly of FIG. 2 in a first or unloaded configuration, with a flange of the handle assembly removed for clarity.

An exemplary lever assembly 30 of one or more aspects of the present disclosure is shown in FIG. 1 attached to the plug-in module 20 near each of the two corners of the plug-in module 20 that are toward the exterior when the plug-in module 20 is fully inserted into the rack 10. An exemplary lever assembly 30 according to one or more aspects of the present disclosure is shown in greater detail in FIGS. 2A-B. As indicated, the lever assembly 30 is intended for mounting to a removable plug-in module 20 for selectively engaging a lip 18 of a rack 10 for effecting an injection of the plug-in module 20 into the rack 10. In general, the lever assembly 30 of FIGS. 2A-B includes a lever handle 40, a spring 60, a pivot arm 70, a pawl 80, and a pivot axle 90. Note that in the following discussion regarding the lever assembly 30, directions described are from the perspective of the lever handle 40 as shown in FIG. 6, it being understood that the lever handle 40 may be in any orientation relative to the rack 10 and items other than the lever assembly 30.

The lever handle 40 is elongate and has a rearward portion 42 and a forward portion 46 extending along a lever handle longitudinal axis HX. The lever handle 40 has a top panel 48, which is advantageously generally flat. In some aspects, the rearward portion 42 advantageously has a suitable protrusion 43 for aiding in ejection of the plug-in module 20, in a conventional fashion. The top panel 48 has an (external) upper surface 49 on one side and a lower interior surface 50 on the opposing side. In some aspects, a first flange 52a and a second flange 52b extend downwardly from the top panel 48 on opposing sides of the lower interior surface 50. A flange gap G1 is defined between the first flange 52a and the second flange 52b. See FIG. 3B. The rearward portion 42 has a first pivot axis 72 and a second pivot axis 82 that are both fixed relative to the lever handle 40. The second pivot axis 82 is spaced from the first pivot axis 72 and disposed downward farther from the lower interior surface 50 than the first pivot axis 72. In some aspects, the first and second pivot axes 72,82 are disposed on downward extensions 53a,53b of the first and second flanges 52a,52b, respectively. Suitable holes 54a,54b are provided in the first and second flanges 52a,52b for accepting corresponding pivot axles 34,90 along the first and second pivot axes 72,82, respectively. In some aspects, the lever handle 40 optionally includes catch 58 that is pivotally mounted toward the lever handle's free end, and is advantageously spring biased to be deployed parallel to the lever handle's longitudinal axis HX.

The spring 60 is mounted to the lever handle 40. The spring 60, in some aspects, is a leaf spring 60, although other forms of springs may be used instead. In some aspects, the spring 60 is curved in one direction in its medial portion 64, and curved in an opposite direction towards its ends 61,62. Such curving of the spring 60 facilitates its mounting to the lever handle 40, as explained further below. In some aspects the spring 60 may have multiple layers, such as being a stack of two or more leaf springs. In some aspects, the spring 60 may be one or more coil springs (e.g., oriented perpendicular to lever handle longitudinal axis HX).

The pivot arm 70 is pivotally mounted to the lever handle 40 for rotation relative to the lever handle 40 about the first pivot axis 72. The pivot arm 70 has a rearward portion 76 configured to accept pivot axle 34 for pivotally mounting the pivot arm 70 to the lever handle 40. The pivot axle 34, in some aspects, extends through both the first and second flanges 52a,52b, advantageously by extending through holes 54a,54b in extensions 53a,53b disposed on the first pivot axis 72. The pivot arm 70 extends generally forwardly, and includes a forward free end 74 abutting the spring 60. The rearward portion 76 includes a bearing surface 78 disposed proximate the first pivot axis 72 for abutting with the pawl 80 (such as at the pawl's forward bearing surface 88 discussed below), and transmitting forces, as discussed further herein. In some aspects, the pivot arm's bearing surface 78 is angled relative to the lower interior surface 50 when the pivot arm's free end 74 is rotated so as to be parallel to the lower interior surface 50 (see FIG. 6) such as when the lever assembly 30 is in the first configuration (discussed below). In some aspects, the rearward portion 76 also includes a stop feature 77, such as a protrusion extending in a direction away from the first pivot axis 72, that is configured to interact with a suitable feature on the lever handle 40, to help prevent the forward free end 74 of the pivot arm 70 from rotating too far away from the lower interior surface 50, in order to facilitate handling of the lever assembly 30. As can be seen in the figures, the pivot arm 70 is disposed operatively between the pawl 80 and the spring 60 such that the pawl 80 is spaced from the spring 60.

Figure 3A:
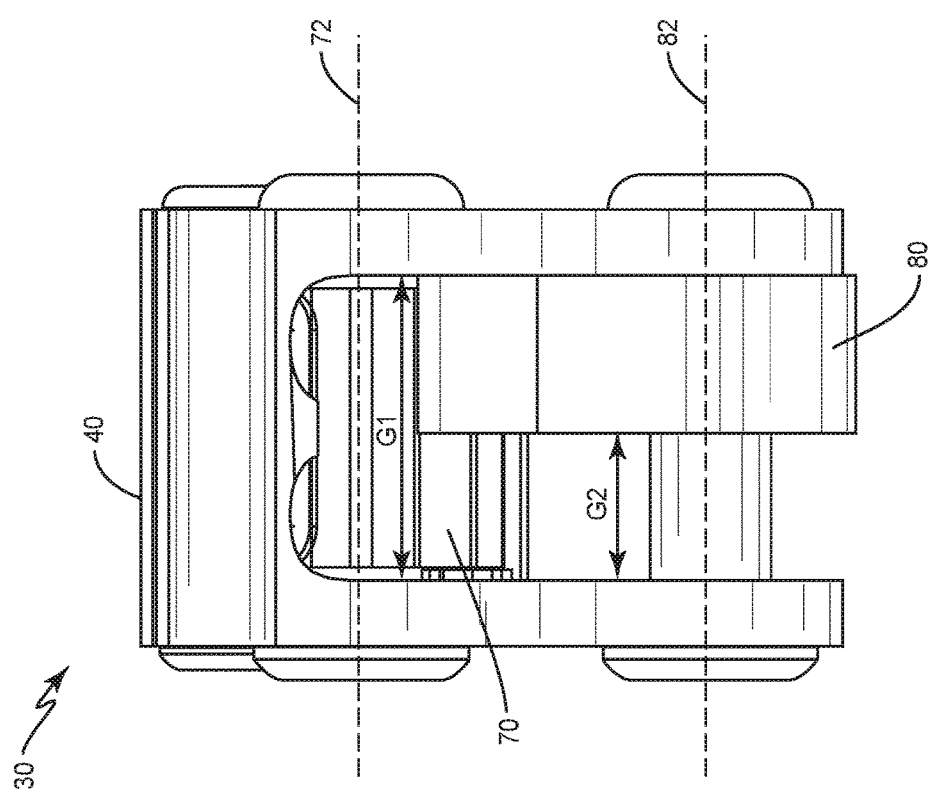
FIG. 3A shows a rear view of a handle assembly of the lever assembly of FIG. 2.
Figure 3B:
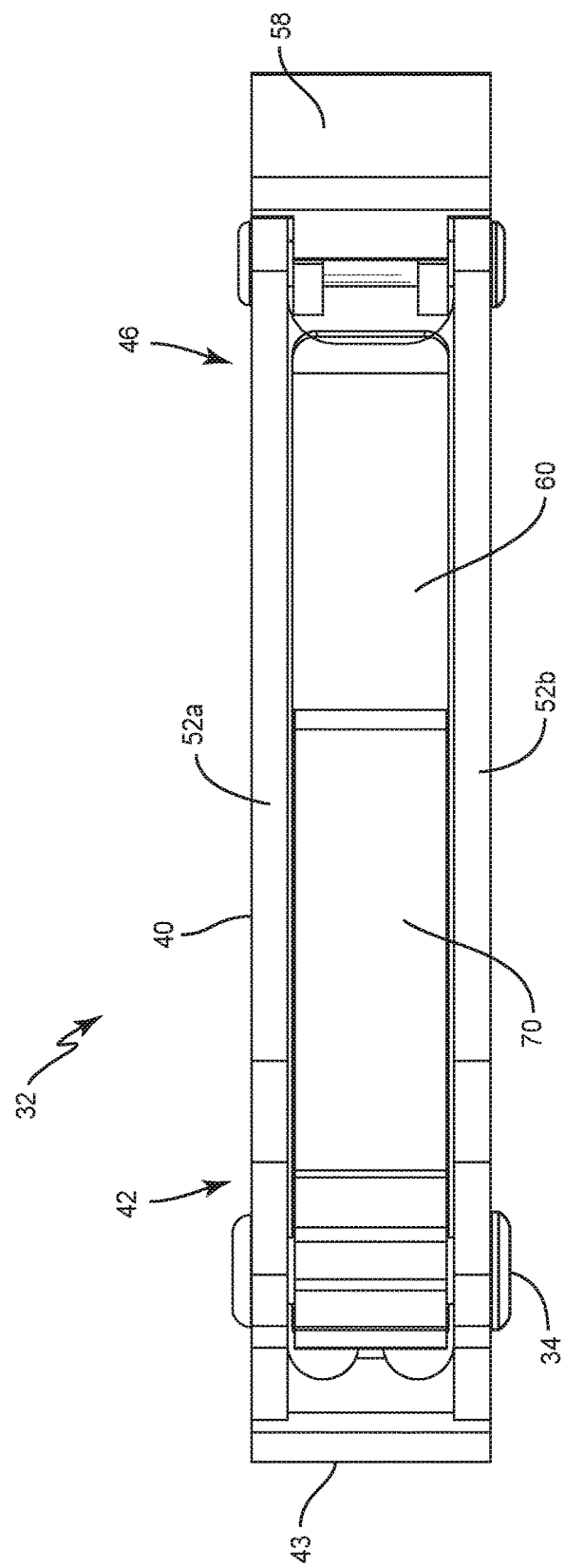
FIG. 3B shows an underside view of the handle assembly of FIG. 3A.
Figure 4:
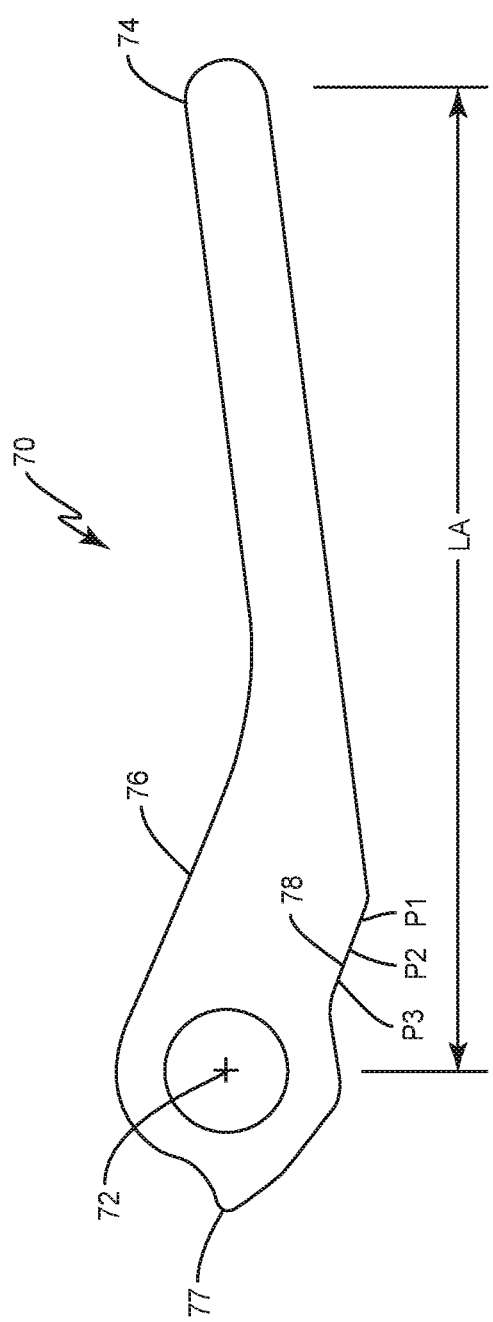
FIG. 4 shows a side view of an arm of the lever assembly of FIG. 2.
Figure 5:
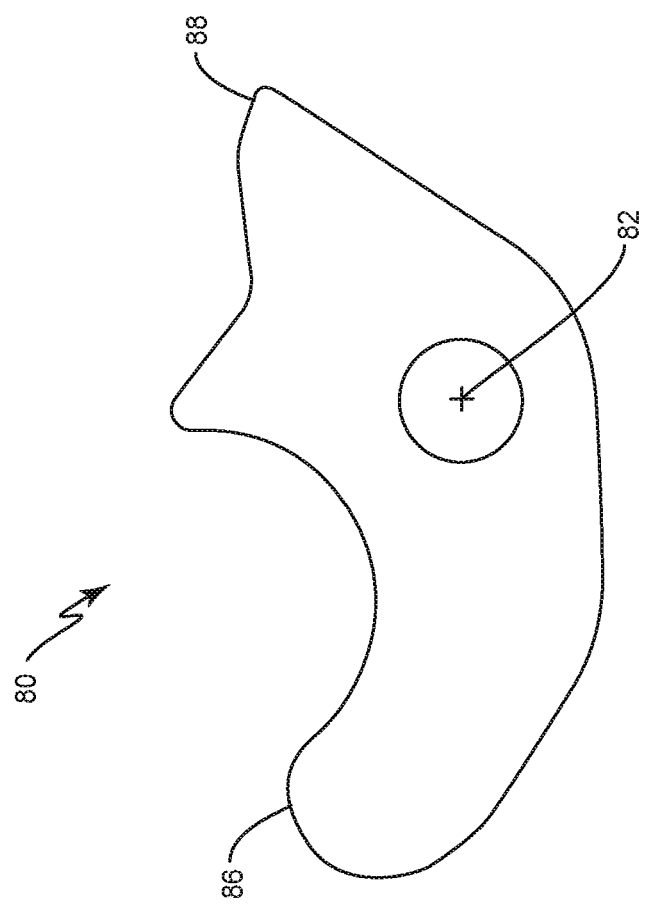
FIG. 5 shows a side view of a pawl of the lever assembly of FIG. 2.

The pawl 80 is pivotally mounted to the lever handle 40 for rotation relative to the lever handle 40 about the second pivot axis 82. The pawl 80 has a rearward tip 86 and a forward bearing surface 88. As can be seen in FIG. 3A, the pawl 80 is thinner than the flange gap G1, so that there is space or gap G2 between the pawl 80 and at least one of the first and second flanges 52a,52b. The pawl 80 is advantageously laterally fixed relative to the first and second flanges 52a,52b.

Figure 2B:
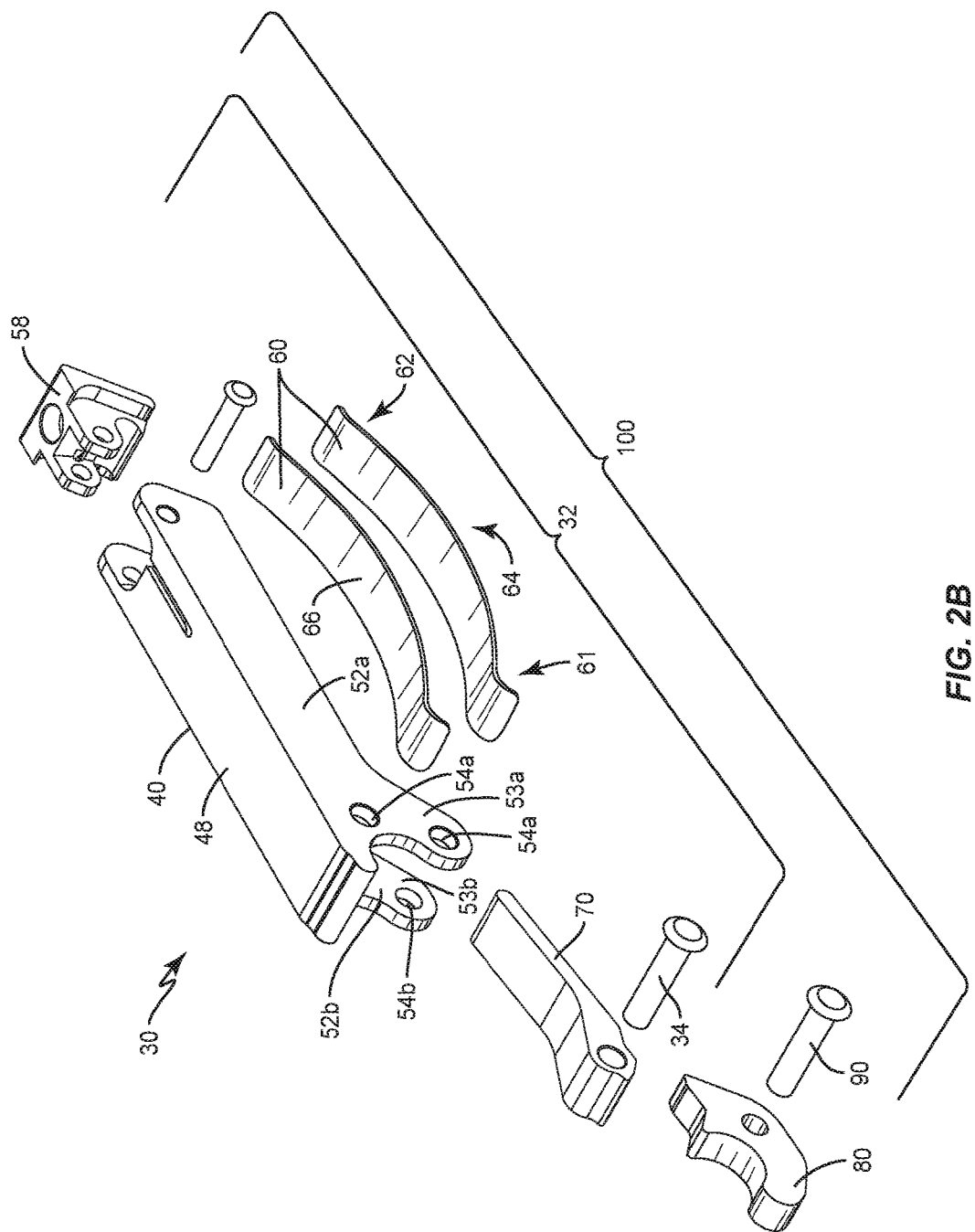
FIG. 2B shows an exploded view of the lever assembly of FIG. 2.

Pivot axle 90 mounts the pawl 80 to the lever handle 40 for rotation about the second pivot axis 82. In FIG. 2B, the pivot axle 90 is illustrated as a rivet prior to having its head upset (deformed). In FIG. 3A, the pivot axle is shown as a rivet with an upset head, as would be typically found in a fully assembled condition. However, a rivet is not required, and the pivot axle 90 may take any suitable form, such as a pivot pin, a rivet, a bolt (with or without a rotatable collar), or any other pin, rod, or shaft that allows the pawl 80 to be rotatably mounted to the lever handle 40. In some aspects, the pivot axle 90 extends through both the first and second flanges 52a,52b, advantageously by extending through holes 54a,54b in extensions 53a,53b disposed on the second pivot axis 82.

The pivot arm 70 and the pawl 80 are configured such that, in response to a force being applied to the pivot arm's forward free end 74, urging the pivot arm 70 to rotate away from the lower interior surface 50, while the pawl 80 abuts the pivot arm 70, the force is transmitted to the pawl 80 so that the pawl's rearward tip 86 is urged to rotate upward.

The lever assembly 30 is movable between at least two configurations. A first configuration, which may be referred to as the least loaded configuration, is shown in FIG. 6. In this first configuration, the arm spacing distance DA, between the pivot arm's forward free end 74 and the lower interior surface 50, is a first spacing amount. In addition, the pawl vertical displacement distance DP, between the second pivot axis 82 and the pawl's tip 86, measured perpendicular to the lever handle longitudinal axis HX, is a first displacement amount. In some aspects, the spring 60 is in a free state in the first configuration. In some aspects, the pivot arm 70 extends between the first and second flanges 52a,52b in the first configuration, such that the pivot arm 70 is not visible in side view of the lever assembly 30, and the forward end of the pivot arm 70 is parallel to the longitudinal axis of the lever handle 40.

Figure 7:
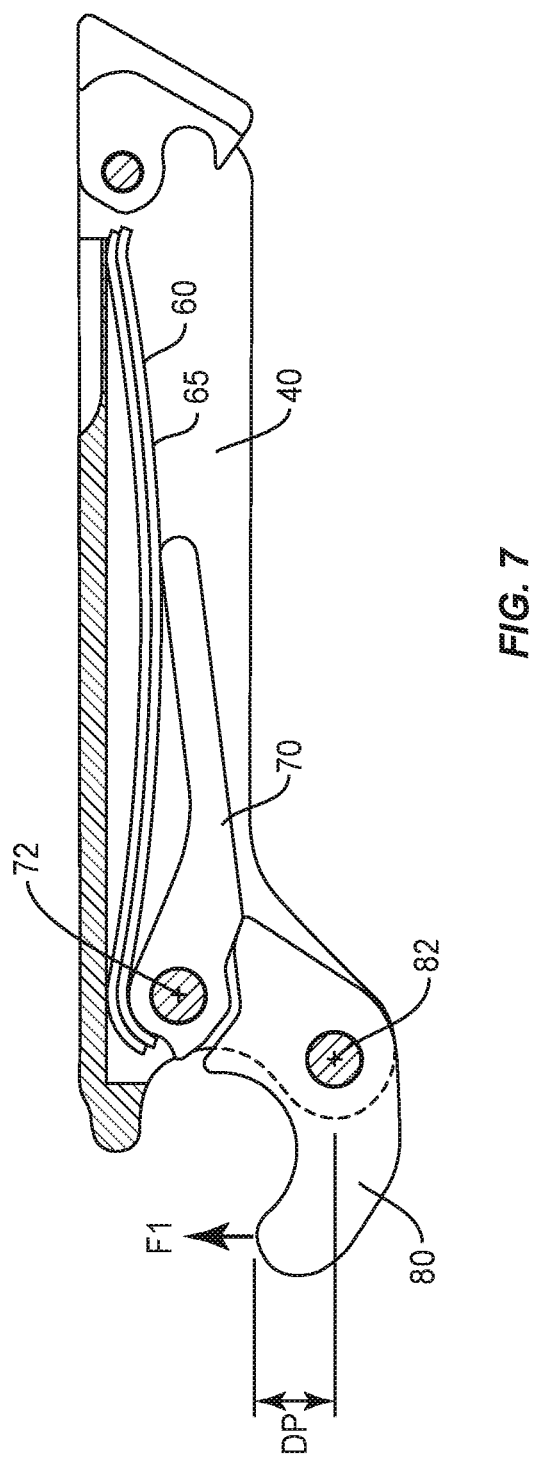
FIG. 7 shows side view of the lever assembly of FIG. 6 in a second or partially loaded configuration, with a flange of the handle assembly removed for clarity.

A second configuration of the lever assembly 30 is shown in FIG. 7. This second configuration may be referred to as the more loaded configuration. In the second configuration, the pivot arm 70 is rotated about the first pivot axis 72 in a first direction (counter-clockwise in FIG. 7) relative to its position in the first configuration. Likewise, the pawl 80 is rotated about the second pivot axis 82 in the first direction (counter-clockwise in FIG. 7) relative to its position in the first configuration. This movement of the pivot arm 70 and the pawl 80 results in the arm spacing distance DA being a second spacing amount, smaller than the first spacing amount. In addition, the pawl vertical displacement distance DP is a second displacement amount, smaller than the first displacement amount. And, the spring 60 is deformed toward the lower interior surface 50 so that the spring 60 is more loaded than in the first configuration. Further, the pawl's forward bearing surface 88 presses against the pivot arm 70 so as to press the pivot arm's forward free end 74 toward the lower interior surface 50 against a resisting bias of the spring 60. In some aspects, the pivot arm 70 extends between the first and second flanges 52a,52b in the second configuration, such that the pivot arm 70 is not visible in side view of the lever assembly 30, and the forward end of the pivot arm 70 is angled toward the longitudinal axis HX of the lever handle 40.

Figure 8:
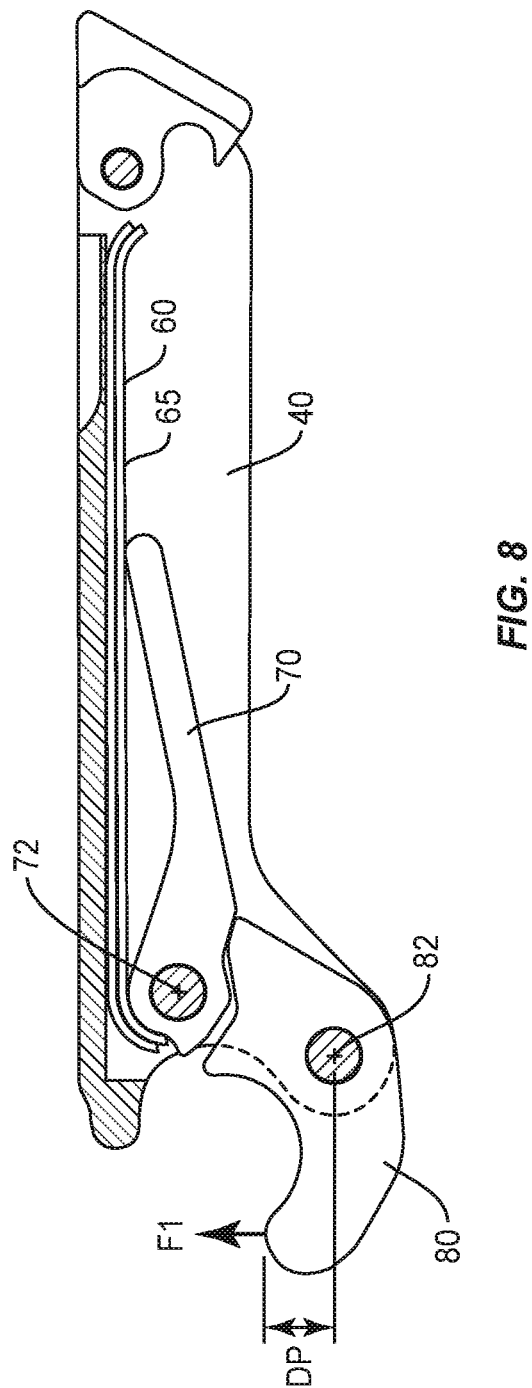
FIG. 8 shows side view of the lever assembly of FIG. 6 in a third or fully loaded configuration, with a flange of the handle assembly removed for clarity.
Figure 9:
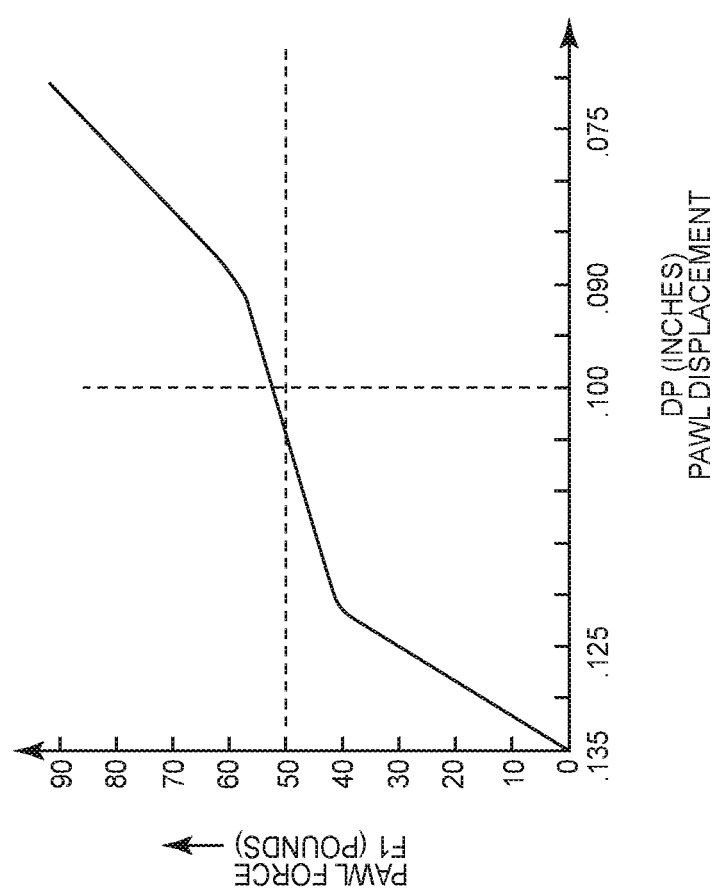
FIG. 9 shows a pawl force vs. pawl displacement graph.
Figure 10:
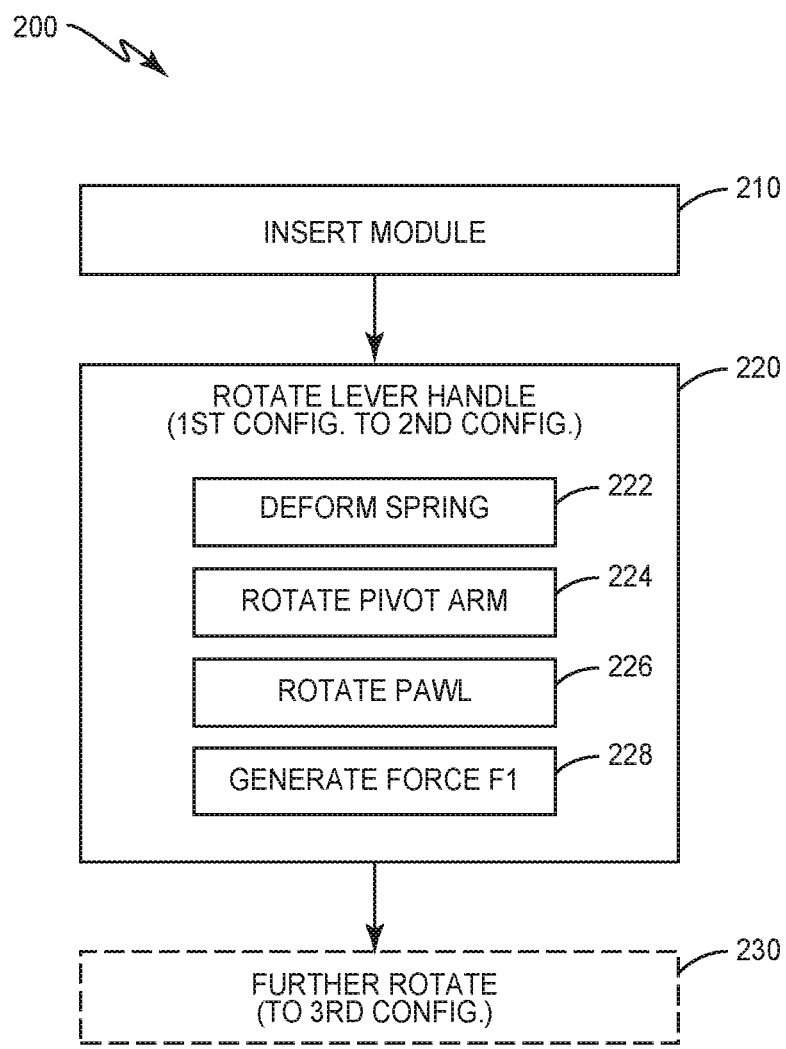
FIG. 10 shows an exemplary method of one or more aspects.

In some aspects, the lever assembly 30 is movable to a third configuration. See FIG. 8. This third configuration may be referred to as the most (or fully) loaded configuration, because the spring 60 is flat against the lower interior surface 50, and cannot deform more. In the third configuration, the pivot arm 70 is rotated further about the first pivot axis 72 in the first direction (counter-clockwise in FIG. 8) relative to its position in the second configuration. Likewise, the pawl 80 is further rotated about the second pivot axis 82 in the first direction (counter-clockwise in FIG. 8) relative to its position in the second configuration. This further movement of the pivot arm 70 and the pawl 80 results in the arm spacing distance DA being a third spacing amount, smaller than the second spacing amount. In addition, the pawl 80 vertical displacement distance DP is a third displacement amount, smaller than the second displacement amount. And, the spring 60 is further deformed toward the lower interior surface 50 so that the spring 60 is more loaded than in the second configuration. In some aspects, the upper surface 66 of the medial portion 64 of the spring 60 is flat against the lower interior surface 50, so that the forward free end 74 of the pivot 70 arm is as close to the lower interior surface 50 as it can get. In the third configuration, the pawl's forward bearing surface 88 continues to press against the pivot arm 70 so as to press the pivot arm's free end 74 toward the lower interior surface 50 against the resisting bias of the spring 60.

Due to the configuration of the pivot arm 70 and the pawl 80, in some aspects, the pivot arm 70 rotates about the first pivot axis 72 about the same as the pawl 80 rotates about the second pivot axis 82, for a given amount of rotation of the lever handle 40 relative to the plug-in module 20. In other aspects, the pivot arm 70 rotates about the first pivot axis 72 more or less than the pawl 80 rotates about the second pivot axis 82.

Note that the pawl 80 remains spaced from the spring 60 in the first configuration, the second configuration, the third configuration, and when moving between any of those configurations. Further, it should be noted that there can be additional configurations of the lever assembly 30, e.g., between the first configuration and the second configuration and/or the third configuration.

As can be seen from comparing the first configuration (FIG. 6) to the second configuration (FIG. 7), the pawl's forward bearing surface 88 abuts the pivot arm 70 at different locations in the first and second configurations. In the first configuration, pawl's forward bearing surface 88 abuts the pivot arm 70 at point P1. In the second configuration, the pawl's forward bearing surface 88 abuts the pivot arm 70 at point P2. Point P2 is closer to the first pivot axis 72 than point P1. Indeed, in some aspects, point P2, where the pawl's forward bearing surface 88 abuts the pivot arm 70, is not more than ⅓ of the way from the first pivot axis 72 to the point where the pivot arm's forward free end 74 abuts the spring 60. Thus, the force of the spring 60, urging the pivot arm's forward free end 74 to rotate away from the lower interior surface 50 is transmitted to the pawl 80 with a mechanical advantage of at least 3:1. Further, the mechanical advantage is greater as the abutment point moves toward the first pivot axis 72. Thus, in the third configuration, the mechanical advantage is greater than in the second configuration, because the pawl's forward bearing surface 88 abuts the pivot arm 70 at point P3, rather than point P2, and P3 is closer to the first pivot axis 72 than point P2.

As discussed above, the lever assembly 30 is intended to be mounted to a plug-in module 20. After the plug-in module 20 is slid, along the guides 16, most of the way into the corresponding slot, the lever handle 40 is rotated toward the plug-in module 20. This rotation takes place about the second pivot axis 82, because the lever assembly 30 is mounted to the plug-in module 20 by the pivot axle 90, as described below. Rotating the lever handle 40 causes the entire lever assembly 30 to rotate until the pawl's rearward tip 86 abuts against the lip 18. With reference to the Figures, at this point the lever assembly 30 is in the first configuration of FIG. 6, and pawl vertical displacement distance DP is, in some aspects, about 0.135 inches. As the lever handle 40 is rotated further relative to the plug-in module 20, the pawl 80 starts rotating relative to the lever handle 40 (in a counter-clockwise direction for the Figures) about the second pivot axis 82. This has the effect of decreasing the pawl vertical displacement distance DP. The pawl's rotation also causes the pawl's forward bearing surface 88 to press against the pivot arm's bearing surface 78, and thereby urge the pivot arm 70 to rotate relative to the lever handle 40 (in a counter-clockwise direction in the Figures) about the first pivot axis 72. As the pivot arm 70 rotates, the pivot arm's forward free end 74 is displaced toward the lower interior surface 50 against the bias of the spring 60. This has the effect of decreasing the arm spacing distance DA. Accordingly, the spring 60 is changed from a lower load state to a higher load state due to the deformation of the spring 60 toward the lower interior surface 50 by the action of the pivot arm 70. The rotation of the lever assembly 30 results in the lever assembly 30 assuming the second configuration, see FIG. 7. In the second configuration, the force of the spring 60 against the pivot arm 70 is transmitted to the pawl 80, and thus to the lip 18, and vice versa. The action of deflecting the spring 60 toward the lower interior surface 50 helps determine the force-displacement curve of the lever assembly 30. Thus, the spring's mechanical characteristics, along with the mechanical advantage of the effective length of the pivot arm 70 versus the distance between the abutment point (between the pawl's forward bearing surface 88 and the pivot arm bearing surface 78) and the first pivot axis 72, determine how much force F1 is generated at the pawl's rearward tip 86 for a given amount of pawl 80 vertical displacement, in the various configurations of the lever assembly 30. In some aspects, in the second configuration, the second displacement amount is not more than 0.10 inches, and the lever assembly 30 is configured to generate, in the second configuration, an upward force F1 at the rearward tip of at least thirty pounds, and advantageously at least fifty pounds, and not more than one hundred twenty pounds.

Moving the lever assembly 30 from the second configuration (FIG. 7) to the third configuration (FIG. 8) involves further rotation of the lever handle 40 toward the plug-in module 20. Advantageously, in the third configuration, the lever handle 40 is rotated such that the lever handle longitudinal axis HX is perpendicular to the insertion direction of the plug-in module (relative to the rack 10). The further rotation causes the pawl 80 to further rotate relative to the lever handle 40 (in a counter-clockwise direction for the Figures) about the second pivot axis 82, resulting in a further decrease of the pawl vertical displacement distance DP. The pawl's further rotation also causes, via the interaction of the pawl's forward bearing surface 88 against the pivot arm's bearing surface 78, the pivot arm 70 to be urged to further rotate relative to the lever handle 40 (in a counter-clockwise direction in the Figures) about the first pivot axis 72, resulting in further displacement of the pivot arm's forward free end 74 toward the lower interior surface 50 against the bias of the spring 60. This has the effect of further decreasing the arm spacing distance DA. Accordingly, the spring 60 is loaded more than in the second configuration due to the further deformation of the spring 60 toward the lower interior surface 50 by the action of the pivot arm 70. In the third configuration, the force of the spring 60 against the pivot arm 70 is transmitted to the pawl 80, and thus to the lip 18, and vice versa.

In some aspects, the lever assembly 30 is fully assembled. In some aspects, the lever assembly 30 is partially disassembled and provided in a lever assembly kit 100. The lever assembly kit 100 is for forming a lever assembly 30 for mounting to a removable plug-in module 20 for selectively engaging a lip 18 on a rack 10 for effecting an injection of the module 20 into the rack 10. The lever assembly kit 100 includes a handle assembly 32, pawl 80, and pivot axle 90. The handle assembly 32 includes the lever handle 40, the spring 60 mounted to the lever handle 40, and the pivot arm 70 pivotally mounted to the lever handle 40 for rotation relative to the lever handle 40 about the first pivot axis 72. For the lever assembly kit 100, the pawl 80 is not operatively mounted to the lever handle 40 so as to be distinct from the lever handle 40 and the pivot arm 70. As indicated above, the pawl 80 has a rearward tip 86 and a forward bearing surface 88. For the lever assembly kit 100, the pivot axle 90 is not operatively mounted to the lever handle 40 so as to be distinct from the lever handle 40. As indicated above, the pivot axle 90 is configured to mount the pawl 80 to the lever handle 40 for rotation about the second pivot axis 82, typically by extending through the first and second flanges 52a,52b of the lever handle 40, when present. As indicated above, the lever handle 40, the pivot arm 70, and the pawl 80 are configured such that, when the pawl 80 is mounted to the lever handle 40 via the pivot axle 90 for rotation about the second pivot axis 82: 1) the pivot arm 70 and the pawl 80 abut one another so that a rotational force applied to the pivot arm's forward free end 74, urging the pivot arm 70 to rotate away from the lower interior surface 50, is transmitted to the pawl 80 so that the pawl's rearward tip 86 is urged to rotate upward; and 2) the pivot arm 70 is disposed operatively between the pawl 80 and the spring 60 such that the pawl 80 is spaced from the spring 60. Advantageously, for the lever assembly kit 100, the pivot arm 70 and the pawl 80 are configured so that, when pawl 80 is mounted to the lever handle 40 via the pivot axle 90 for rotation about the second pivot axis 82, an engagement point between the pivot arm 70 and the pawl 80 moves toward the first pivot axis 72 in response to the pawl 80's rearward tip being rotated away from the lower interior surface 50.

In some aspects, when the lever assembly 30 is assembled, the lever handle 40 is 0.16 inches long between the tip thereof on its forward portion 46 and the first pivot axis 72; the pivot arm 70 is 0.7 inches long between the pivot arm's forward free end 74 and the first pivot axis 72; the first and second pivot axes 72,82 are spaced apart 0.25 inches; and the rearward tip of the pawl 80 is disposed 0.14 inches from the second pivot axis 82; and the spring 60 is 0.14 inches thick and made from stainless steel. The lever handle 40, the pivot arm 70, and the pawl 80 are advantageously made from aluminum. The pivot axles 34,90 are advantageously 0.9 inches in diameter.

In some aspects, a method 200 is provided for inserting a removable plug-in module 20 into a rack 10, the rack 10 having a lip 18 for facilitating insertion of the plug-in module 20. The method 200 includes inserting 210 the plug-in module 20 into the rack 10, and rotating 220 lever handle 40 relative to the plug-in module. In particular, the method 200 includes rotating 220 a lever handle 40 of a first lever assembly 30 in a first direction toward the plug-in module 20, about the second pivot axis 82. As indicated above, the first lever assembly 30 is mounted to the plug-in module 20 proximate an edge of the plug-in module 20. The lever assembly 30 is as described herein. The rotating 220 occurs while the pawl 80 engages the lip 18 of the rack 10, and the rotating causes: 1) deforming 222 of the spring 60; 2) rotating 224 of the pivot arm 70, relative to the lever handle 40, about the first pivot axis 72 in a second direction while bearing against the spring 60; 3) rotating 226 the pawl 80, relative to the lever handle 40, about the second pivot axis 82 in the second direction; 4) generating 228 of a force F1 at the rearward tip 86 of the pawl 80, oriented upward toward the lever handle 40 longitudinal axis HX, urging the rearward tip 86 against the lip 18. During the rotating, the pivot arm 70 stays operatively disposed between the pawl 80 and the spring 60 such that the pawl 80 remains spaced from the spring 60 throughout the rotating 220. The rotating advantageously causes the lever assembly 30 to change from the first configuration to the second configuration, described above. In some aspects, the rotating 220 causes an engagement point between the pawl 80 and the pivot arm 70 to move toward the first pivot axis 72. In some aspects, in the second configuration: a) the second displacement amount is not more than 0.10 inches; and b) the force F1 at the rearward tip 86 of the pawl 80 is at least fifty pounds and not more than one hundred twenty pounds.

In some aspects, the method 200 continues with further rotating 230 the lever handle 40 in the first direction toward the plug-in module 20 so that the lever assembly 30 assumes a third configuration wherein the spring 60 becomes fully loaded (e.g., a center portion of the spring 60 just starts to abut against the lower interior surface 50). While moving from the second configuration to the third configuration, the force F1 at the rearward tip 86 of the pawl 80 remains at least fifty pounds and not more than one hundred twenty pounds.

Because the lever assembly 30 applies a variable amount of force when changing from the first configuration to the second and/or third configuration(s), the lever assembly 30 may be referred to as a variable force injector.

The discussion above has generally been in the context of the spring 60 being a leaf spring or a stack of leaf springs. However, the spring 60 can take other forms, such as one or more coil springs (e.g., oriented perpendicular to lever handle longitudinal axis HX). Further, in some aspects, the lever assembly 30 is a described above, but with spring 60 replaced with an elastic bias element, typically disposed between the forward free end 74 of the pivot arm 70 and the lower interior surface 50. The term "spring" refers to conventional mechanical springs (e.g., leaf spring, coil spring), while the term "elastic bias element" refers to the broader class of elastically deformable elements, which include springs. Additional examples of an elastic bias element include a block of an elastically deformable material (e.g., closed-cell foam), a variable density stack of elastic material (to provide a non-linear spring constant), or any other repeatably elastically deformable element. In some aspects, the elastic bias element (or spring 60), is disposed in other locations, not between the forward free end 74 of the pivot arm 70 and the lower interior surface 50, but still provides a resilient force that biases the pivot arm 70 to rotate away from the lower interior surface 50, such as by being a torsion spring disposed about first pivot axis 72.

The disclosures of any patents/applications disclosed herein are hereby incorporated herein by reference in their entirety.

The present disclosure may, of course, be carried out in other ways than those specifically set forth herein without departing from essential characteristics of the disclosure. The present embodiments are to be considered in all respects as illustrative and not restrictive, and all changes coming within the meaning and equivalency range of the appended claims are intended to be embraced therein.

What is claimed is:

1. A lever assembly for mounting to a removable plug-in module for selectively engaging a lip of a rack for effecting an injection of the plug-in module into the rack, the lever assembly comprising:
    an elongate lever handle having a rearward portion and a forward portion extending along a lever handle longitudinal axis; the lever handle having a lower interior surface; the rearward portion having a first pivot axis and a second pivot axis that are both fixed relative to the lever handle; wherein the second pivot axis is spaced from the first pivot axis and disposed downward farther from the lower interior surface than the first pivot axis;
    an elastic bias element mounted to the lever handle;
    a pivot arm pivotally mounted to the lever handle for rotation relative to the lever handle about the first pivot axis; the pivot arm having a forward free end abutting the elastic bias element;
    a pawl pivotally mounted to the lever handle for rotation relative to the lever handle about the second pivot axis; the pawl having a rearward tip and a forward bearing surface;
    a pivot axle mounting the pawl to the lever handle for rotation about the second pivot axis;
    wherein the pivot arm is disposed operatively between the pawl and the elastic bias element such that the pawl is spaced from the elastic bias element;
    wherein the pivot arm and the pawl are configured such that, in response to a force being applied to the pivot arm's forward free end, urging the pivot arm to rotate away from the lower interior surface, while the pawl abuts the pivot arm, the force is transmitted to the pawl so that the pawl's rearward tip is urged to rotate upward.

2. The lever assembly of claim 1:
    wherein the lever assembly is movable between a first configuration and a second configuration;
    wherein, in the first configuration:
        an arm spacing distance between the pivot arm's free end and the lower interior surface is a first spacing amount;
        a pawl vertical displacement distance between the second pivot axis and the pawl's tip, measured perpendicular to the lever handle longitudinal axis, is a first displacement amount;
    wherein, in the second configuration:
        the arm spacing distance is a second spacing amount, smaller than the first spacing amount;
        the pawl vertical displacement distance is a second displacement amount, smaller than the first displacement amount;
        the elastic bias element is more loaded than in the first configuration;
        the pawl's bearing surface presses against the pivot arm so as to press the pivot arm's free end toward the lower interior surface against a resisting bias of the elastic bias element;
    wherein the pawl remains spaced from the elastic bias element in both the first and second configurations.

3. The lever assembly of claim 2, wherein the pawl's bearing surface abuts the pivot arm at different locations in the first and second configurations.

4. The lever assembly of claim 2, wherein the elastic bias element is in a free state in the first configuration.

5. The lever assembly of claim 2, wherein, in the second configuration, the pawl's bearing surface abuts the pivot arm at a location not more than ⅓ of the way from the first pivot axis to the point where the pivot arm's forward free end abuts the elastic bias element.

6. The lever assembly of claim 2, wherein the pivot arm includes a bearing surface disposed proximate the first pivot axis and configured to be abutted by the pawl's forward bearing surface; wherein the pivot arm's bearing surface is angled relative to the lower interior surface when the assembly is in the first configuration.

7. The lever assembly of claim 2, wherein the lever assembly is further movable to a third configuration; wherein, in the third configuration:
    the arm spacing distance is a third spacing amount, smaller than the second spacing amount;
    the pawl vertical displacement distance is a third displacement amount, smaller than the second displacement amount;
    the elastic bias element is more loaded than in the second configuration;
    the pawl's bearing surface presses against the pivot arm so as to press the pivot arm's free end toward the lower interior surface against the resisting bias of the elastic bias element;

the pawl remains spaced from the elastic bias element.

8. The lever assembly of claim 1, wherein the elastic bias element comprises a first leaf spring.

9. The lever assembly of claim 1:
- wherein the lever handle includes first and second downwardly extending flanges disposed on opposing sides of the lower interior surface with a flange gap therebetween;
- wherein the first and second pivot axes both extend through both the first and second flanges;
- wherein the pawl is thinner than the flange gap.

10. The lever assembly of claim 2:
- wherein the second displacement amount is not more than 0.10 inches in the second configuration;
- wherein the lever assembly is configured to generate, in the second configuration, an upward force at the rearward tip of at least fifty pounds and not more than one hundred twenty pounds.

11. A lever assembly kit, for forming a lever assembly for mounting to a removable plug-in module for selectively engaging a lip on a rack for effecting an injection of the module into the rack, the kit comprising:
- a handle assembly; the handle assembly comprising:
   - an elongate lever handle having a rearward portion and a forward portion extending along a lever handle longitudinal axis; the rearward portion having a first pivot axis and a second pivot axis that are both fixed relative to the lever handle; the lever handle having a lower interior surface; wherein the second pivot axis is spaced from the first pivot axis and disposed downward farther from the lower interior surface than the first pivot axis;
   - an elastic bias element mounted to the lever handle;
   - a pivot arm pivotally mounted to the lever handle for rotation relative to the lever handle about the first pivot axis; the pivot arm having a forward free end configured to abut the elastic bias element;
- a pawl not operatively mounted to the lever handle so as to be distinct from the lever handle and the pivot arm; the pawl having a rearward tip and a forward bearing surface;
- a pivot axle not operatively mounted to the lever handle so as to be distinct from the lever handle; the pivot axle configured to mount the pawl to the lever handle for rotation about the second pivot axis;
- wherein the lever handle, the pivot arm, and the pawl are configured such that, when the pawl is mounted to the lever handle via the pivot axle for rotation about the second pivot axis:
   - the pivot arm and the pawl abut one another so that a rotational force applied to the pivot arm's forward free end, urging the pivot arm to rotate away from the lower interior surface, is transmitted to the pawl so that the pawl's rearward tip is urged to rotate upward; and
   - the pivot arm is disposed operatively between the pawl and the elastic bias element such that the pawl is spaced from the elastic bias element.

12. The lever assembly kit of claim 11, wherein the pivot arm and the pawl are configured so that, when pawl is mounted to the lever handle via the pivot axle for rotation about the second pivot axis, an engagement point between the pivot arm and the pawl moves toward the first pivot axis in response to the pawl's rearward tip being rotated away from the lower interior surface.

13. The lever assembly kit of claim 11:
- wherein the lever handle includes first and second downwardly extending flanges disposed on opposing sides of the lower interior surface with a flange gap therebetween;
- wherein the first and second pivot axes both extend through both the first and second flanges;
- wherein the pawl is thinner than the flange gap;
- wherein the pivot axle is configured to mount the pawl to the lever handle for rotation about the second pivot axis by extending through the first and second flanges.

14. The lever assembly kit of claim 11, wherein the elastic bias element is a leaf spring.

15. The lever assembly kit of claim 11, wherein the pivot arm and the pawl are configured so that, when the pawl is mounted to the lever handle, an engagement point between the pivot arm and the pawl is not more than ⅓ of the way from the first pivot axis to a point where the pivot arm's forward free end abuts the elastic bias element.

16. A method of inserting a removable plug-in module into a rack, the rack having a lip for facilitating insertion of the plug-in module, the method comprising:
- inserting the plug-in module into the rack;
- rotating a lever handle of a first lever assembly in a first direction toward the plug-in module; the first lever assembly mounted to the plug-in module proximate an edge of the plug-in module; the lever handle extending along a lever handle longitudinal axis and having a lower interior surface;
- wherein the first lever assembly comprises:
   - the lever handle;
   - a pivot arm mounted to the lever handle for rotation about a first pivot axis that is fixed relative to the lever handle;
   - a pawl mounted to the lever handle for rotation about a second pivot axis that is fixed relative to the lever handle, wherein the second pivot axis is spaced from the first pivot axis and disposed farther from the lower interior surface than the first pivot axis;
   - an elastic bias element;
- wherein the rotating occurs while the pawl engages the lip of the rack;
- wherein, the rotating causes:
   - the elastic bias element to be deformed;
   - the pivot arm to rotate, relative to the lever handle, about the first pivot axis in a second direction while bearing against the elastic bias element;
   - the pawl to rotate, relative to the lever handle, about the second pivot axis in the second direction;
   - a force to be generated at a rearward tip of the pawl, oriented toward the lever handle longitudinal axis, urging the tip against the lip;
- wherein, during the rotating, the pivot arm stays operatively disposed between the pawl and the elastic bias element such that the pawl remains spaced from the elastic bias element throughout the rotating.

17. The method of claim 16:
- wherein the rotating causes the lever assembly to change from a first configuration to a second configuration;
- wherein the pivot arm comprises free end disposed away from the first pivot axis;
- wherein the pawl comprises the distal tip extending away from the lever handle, and a bearing surface, with the second pivot axis disposed between the tip and the bearing surface;

wherein, in the first configuration:
- an arm spacing distance between the pivot arm's free end and the lower interior surface is a first spacing amount;
- a pawl vertical displacement distance between the second pivot axis and the pawl's tip, measured perpendicular to the lever handle longitudinal axis, is a first displacement amount;

wherein, in the second configuration:
- the arm spacing distance is a second spacing amount, smaller than the first spacing amount;
- the pawl vertical displacement distance is a second displacement amount, smaller than the first displacement amount;
- the elastic bias element is more loaded than in the first configuration;
- the pawl's bearing surface presses against the pivot arm so as to press the pivot arm's free end toward the lower interior surface against a resisting bias of the elastic bias element;

wherein the pawl remains spaced from the elastic bias element in both the first and second configurations.

18. The method of claim 17, wherein, in the second configuration:
- the second displacement amount is not more than 0.10 inches;
- the force at the distal tip of the pawl is at least fifty pounds and not more than one hundred twenty pounds.

19. The method of claim 17:
wherein the elastic bias element is a leaf spring;
further comprising further rotating the lever handle in the first direction toward the plug-in module so that the lever assembly assumes a third configuration wherein a center portion of the leaf spring just starts to abut against the lower interior surface;
wherein, while moving from the second configuration to the third configuration, the force at the distal tip of the pawl remains at least fifty pounds and not more than one hundred twenty pounds.

20. The method of claim 17, wherein the rotating causes an engagement point between the pawl and the pivot arm to move toward the first pivot axis.

* * * * *